United States Patent [19]

Shal et al.

[11] Patent Number: 6,064,646

[45] Date of Patent: May 16, 2000

[54] DATA COMMUNICATION APPARATUS AND METHOD

[75] Inventors: David Andrew Shal, Bellbrook; Richard Clarkson Griffin, Springboro, both of Ohio; Dennis Palmer Griffin, Noblesville; Wayne Dale Moore, Carmel, both of Ind.

[73] Assignees: Delco Electronics Corporation, Kokomo, Ind.; General Motors Corporation, Detroit, Mich.

[21] Appl. No.: 08/938,679

[22] Filed: Sep. 26, 1997

[51] Int. Cl.[7] .............................. H03K 7/08; H03K 9/08; H03M 5/08

[52] U.S. Cl. ............................................ 370/212; 375/238

[58] Field of Search ........................... 332/109; 318/599, 318/811; 320/145; 347/144, 196; 348/471; 370/205, 212; 375/238; 701/103

[56] References Cited

U.S. PATENT DOCUMENTS

| | | | |
|---|---|---|---|
| 4,428,348 | 1/1984 | Takase et al. .......................... | 123/480 |
| 4,638,225 | 1/1987 | Morinaga et al. ...................... | 318/341 |
| 4,749,927 | 6/1988 | Rodal et al. ........................... | 318/599 |
| 5,023,535 | 6/1991 | Miller et al. ........................... | 318/599 |
| 5,126,944 | 6/1992 | Sakuma et al. ......................... | 701/103 |
| 5,193,146 | 3/1993 | Kohno ................................... | 388/811 |
| 5,317,248 | 5/1994 | Utley et al. ............................. | 318/811 |
| 5,490,556 | 2/1996 | Pichotta ................................ | 165/26 |
| 5,497,062 | 3/1996 | Fenstermacher et al. ............. | 318/599 |

Primary Examiner—Paul R. Myers
Attorney, Agent, or Firm—Robert M. Sigler

[57] ABSTRACT

In a first controller that runs a first control algorithm and a first interrupt service, wherein the first control algorithm includes a first series of commands repeatedly executed in sequence, wherein the first interrupt service performs a second series of commands when the first interrupt service is triggered, wherein the first controller includes a first free running counter with a counter timer value that repeatedly increments and resets when the counter timer overflows, a data communication method comprising the steps of: in each sequential execution of the first series of commands: reading a data signal to be transmitted; responsive to the data signal, computing an on-time; setting a first edge of a serial transmission signal; and loading a register with a value equal to a sum of the first counter value and the on time; independent of the first series of commands: comparing the first counter value to the register value; when the first counter value equals the register value, triggering the first interrupt service; and when the first interrupt service is triggered, resetting a second edge of the serial transmission signal, wherein the first edge is not set again until a new data signal to be transmitted is read.

4 Claims, 4 Drawing Sheets

DATA COMMUNICATION APPARATUS AND METHOD

This invention relates to a data communication apparatus and method.

BACKGROUND OF THE INVENTION

It is known to use microprocessor based devices to communicate data through a serial data line or through a parallel data bus. In one example in which a serial data signal is transmitted, a microprocessor based controller is provided with the processor and a separate free running counter. The microprocessor determines an on-time for a pulse width modulated signal to be transmitted and loads the on time into the register of the free running counter. The free running counter independently increments the counter output value at regular intervals as controlled by an internal system clock and resets the counter output value when the counter output value overflows. A comparator is coupled to the counter's register and the counter output value. The comparator provides an output signal that has one state, for example, High, when the counter is below the value in the register and a second state, for example, Low, when the counter output is above the value in the register. In this manner, the processor computes the on time, or duty cycle, of a pulse width modulated (PWM) output signal and loads the on time into the register, allowing the free running counter and comparator to continuously generate the PWM output signal independent of the flow of the processor control algorithm except as it controls the value in the counter register.

While the above-described apparatus may be suitable for generating PWM control commands for actuators and for generating PWM serial communications in systems where synchronization between the transmitting and receiving devices is not important, it is not suitable for use where synchronization between the generation of a signal being transmitted and the use of that signal in the receiving controller is required. This is because, with the free running counter and comparator, the above-described apparatus continuously generates the PWM output signal independently of the operation of the control algorithm (except for the contents of the register) and contains no synchronization function allowing the receiving processor to synchronize with the transmitting processor.

For example, the transmitting processor may load a value in the register for its free running counter and then turn to other tasks. It might return to reload the register at irregular intervals while all of the time the free running counter is counting through its cycle and driving the serial output based on the output in the register. The receiving controller has no indication when the transmitting controller has updated the signal in the counter register and, thus, cannot base operation on synchronization with updates to the transmitting controller's free running counter register.

SUMMARY OF THE INVENTION

It is an object of this invention to provide a data communication method in accordance with claim 1.

Advantageously, this invention provides a data communication method and apparatus that allows transmission of serial data through a data line by varying the on and off times of a signal on the data line while providing a synchronization function between a transmitting controller and a receiving controller.

Advantageously, this invention provides a data communication method and apparatus in which a transmitting controller makes use of a free running counter, a register and a comparator to drive a serial data signal but does not allow the serial data signal to be driven asynchronously with the control algorithm of the transmitting controller. Advantageously then, the receiving controller receives and decodes the serial data signal and decodes the synchronizing function of the serial data signal so that the receiving controller can process the received data signal synchronously with processing in the transmitting controller.

Advantageously then, according to a preferred example, this invention provides a data communication method for use in a controller that runs a first control algorithm and a first interrupt service, wherein the first control algorithm includes a first series of commands repeatedly executed in sequence, wherein the first interrupt service performs a second series of commands when the first interrupt service is triggered, wherein the first controller includes a first free running counter with a first counter value that repeatedly and regularly increments and resets when the first counter overflows. The data communication method comprises the steps of, during the execution of the first series of commands, (a) reading a data signal to be transmitted, (b) responsive to the data signal, computing an on time, (c) setting a first edge of a serial transmission signal, and (d) loading a register with a value equal to a sum of the first counter value and the on time; independent of the first series of commands, (a) comparing the first counter value to the register value, (b) when the first counter value equals the register value, triggering the first interrupt service and (c) when the first interrupt service is triggered, resetting a second edge of the serial transmission signal wherein the first edge is not set again until a new data signal to be transmitted is read.

According to another preferred example, a second controller includes a second control algorithm containing a third series of commands repeatedly executed in sequence and a second interrupt service including a fourth series of commands executed when the second interrupt service is triggered, wherein the serial transmission signal is transmitted from the first controller to the second controller. The method also comprises the steps of: in the second interrupt service, (a) detecting the first edge of the serial transmission signal, (b) capturing a begin time when the first edge is detected, (c) detecting the second edge of the serial transmission signal, (d) capturing an end time when the second edge is detected, (e) determining a received signal equal to a difference between the end time and the begin time and (f) setting a flag when the received signal is determined; and during each execution of the third series of commands, (a) monitoring the flag, (b) when the flag is set, processing the received signal and (c) after the received signal is processed, resetting the flag, wherein the processing step is not executed again until a new received signal is determined.

BRIEF DESCRIPTION OF THE DRAWINGS

The present invention will now be described by way of example with reference to the following drawings in which.

DETAILED DESCRIPTION OF THE INVENTION

Figure 1:
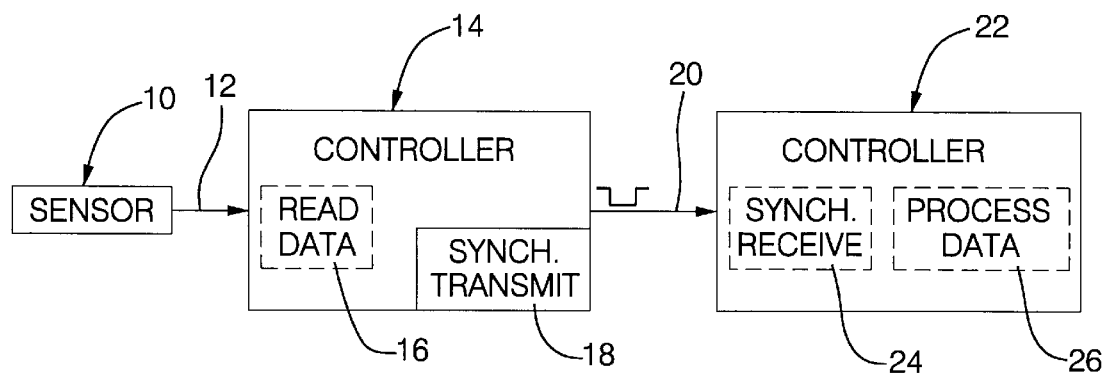
FIG. 1 is an example system schematic according to this invention.

Referring now to FIG. 1, an example data communication apparatus according to this invention is shown including sensor 10, a first microprocessor based controller 14, a serial data communication line 20 and a second microprocessor based controller 22. The sensor 10 is disposed to sense a parameter desired to be measured. For example, sensor 10 may be a steering wheel angle sensor in a motor vehicle. The sensor provides an output signal on line 12 to the controller 14, which receives the signal on line 12 through conventional input circuits. For example, in the event that the signal on line 12 is an analog signal, controller 14 receives the signal vis-à-vis an internal analog-to-digital converter. In the event that the signal on line 12 is a digital signal, the controller 12 receives the signal through a conventional digital signal input port of a type known to those skilled in the art.

In the system shown, the controller 14 performs two main functions with respect to the signal on line 12 from sensor 10. The first function is the read data function 16 that reads the signal on line 12 and converts it to a data signal to be transmitted by the synchronous transmission function 18. The second function is the synchronous transmission function 18 that creates a signal on serial data line 20 having a pulse length corresponding to the value of the data signal. The synchronous transmission function 18 is arranged to transmit only one pulse signal on line 20 for each update of the data signal, as read by read data function 16. Thus, the synchronous transmit function 18 is not free running with respect to the read data signal 16, but is synchronized therewith. The synchronous transmission function 18 is controlled at least partially by a software control algorithm, which continuously performs a series of commands in sequence as described below.

While software control algorithms may be designed so they have a constant fixed loop time, it is possible that software control algorithms have loop times that vary within predetermined ranges depending on the number of conditional operations performed during the control sequence. Thus, it is possible that the signals transmitted on line 20 do not have absolutely uniform periods, but have periods that vary depending on the number of command sequences performed during a given loop of the software control algorithm controlling the synchronous transmission function 18. Further, if the read data function 16 is independent of the software control algorithm, it may be that the data signal is updated in an irregular manner or in a manner not timed to correspond with the software control algorithm, in which case data pulses on serial line 20 are transmitted not with every loop of the software control algorithm but only when the data signal is updated.

The receiving controller 22 receives the serial data signal from line 20 through a serial input port and performs two main functions on the data signal. The first is the synchronous receive function 24, which is triggered by the occurrence of the data signal on line 20 and receives the data signal each time it is transmitted. The second main function of controller 22 is the process data function 26, here representing a generic data process function that processes the data signal, for example, through a filter or mathematical function that requires synchronization with the generation of the data signal.

An example device suitable for use as the transmitting controller 14 is a Motorola™ MC68HC11 microcomputer. An example device suitable for use as receiving controller 24 is a Motorola™ MC68HC11 microcomputer.

Figure 2:
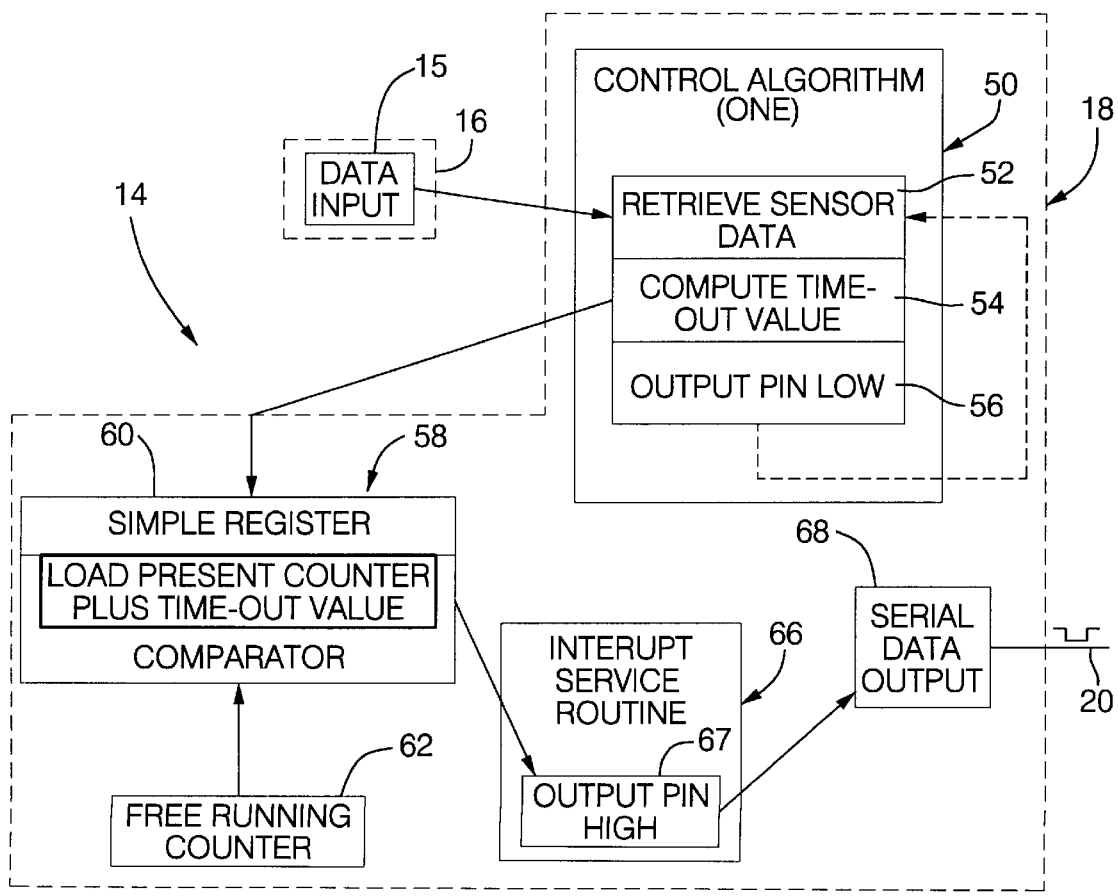
FIG. 2 is an example general function of controller 14 for transmitting serial data.

Referring now to FIG. 2, an example schematic of controller 14 and its functions is shown. The controller 14 includes a control algorithm 50, an interrupt service routine 66, a free running counter 62 and a comparator 58 with a simple register 60 that may be compared to the output of the free running counter 62. The read data function 16 includes the data input for the controller 14 and the synchronous transmit function 18 generates the output signal at the serial data output 68, which drives the signal on line 20.

The control algorithm 50 performs a series of commands programmed in internal memory (not shown) within the microprocessor controller 14, including the commands for retrieving the sensor data and generating the serial communication signal on line 20. More particularly, step 52 retrieves the sensor data from the data input 15. For example, the sensor data is stored as a digital value within a register or memory location designated by the control algorithm 50. Block 54 converts the sensor data to a time out value using a conversion function, for example, programmed into a look-up table of a type readily implemented by one skilled in the art. The time out value represents the on time of the data pulse to be transmitted on line 20. After the on time is computed at block 54, it is summed with the present counter value and the summation result is loaded into the simple register 60 at one input to the comparator 58. It is noted that in the event that the summation of the time out value and the present counter value is greater than the overflow value of the timer, the summation result drops the most significant bit and the remainder is loaded into the simple register 60. This will yield the appropriate result for the comparison described below since, when counter 62 overflows, it resets to zero and continues counting from zero.

After the simple register 60 is loaded, block 56 drives the serial data output 68 to generate the leading edge of this serial data signal on line 20. For example, in a system in which the on time of the data pulse begins with a falling edge, block 56 commands the serial data output 68 to drive the signal on line 20 low. At this point, the control algorithm 50, having received the data signal, loaded the simple register and forced the leading edge of the serial data signal, generally leaves control of the remainder of the generation of the serial data signal on line 20 to the free running counter 62, the comparator 58 and the interrupt service routine 66 while the control algorithm 50 goes on to perform any other control functions programmed into the controller 14.

While the control algorithm 50 is operating the remainder of its control function, the free running control counter 62 continues to increment its output value and, when overflowing, resetting to zero and beginning incrementing again at regular intervals as controlled by the system's internal clock (not shown). The output of the free running counter 62 is continuously fed into the second input of the comparator 58 and compared to the value loaded in the simple register 60. When the output of the free running counter 62 equals the value in the simple register 60, a signal triggers the interrupt service routine 66, which performs a function 67 that drives the output pin of the serial data output 68 High, creating the trailing edge of the serial data signal pulse on line 20.

Thus, the data signal pulse on line 20 is initiated soon after the control algorithm 50 receives a data signal vis-à-vis the read data function 16 and the data signal pulse is terminated when the output of the free running counter 62 matches a value loaded in the register 60, with the time period of the data signal pulse dependent upon the value of the data signal. Thus, the data in the serial data signal pulse on line 20 is contained in the length of the data signal pulse on line 20.

The system shown is synchronized with the sampling of data from the data input 15 because, until the data is updated through the retrieved sensor data function 52, the serial data output 68 cannot be driven low by block 56. Thus, a signal is created on line 20 only when a new data signal is received by the control algorithm 50.

Figure 3:
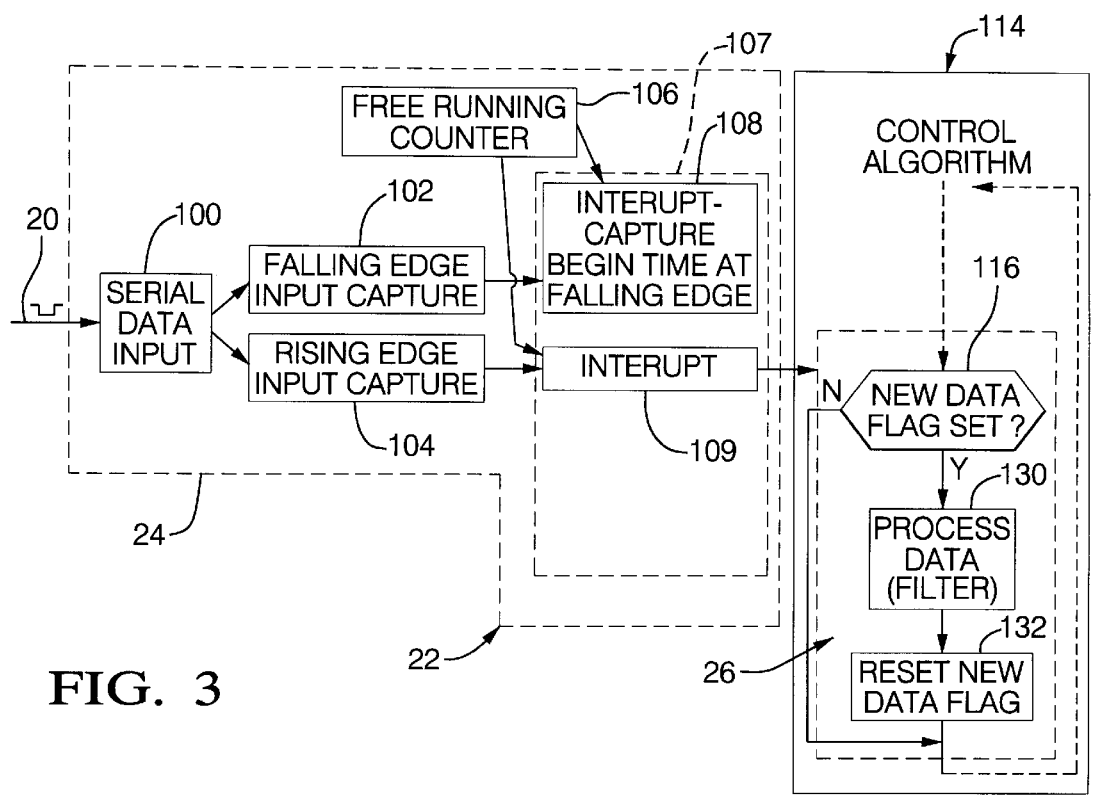
FIG. 3 is an example general function of controller 22 for receiving serial data.

Referring now to FIG. 3, an example of the functions performed by controller 22 for synchronously receiving the data signal on line 20 and processing the data signal are shown. The synchronous receive function 24 is performed by the serial data input 100, which has functions 102 and 104 for sensing the falling and rising edge of the data signal on line 22 and triggering the interrupt routines 108 and 109. The controller 22 also includes a free running counter 106 that increments its output value at regular intervals as controlled by an internal system clock (not shown) and resetting back to zero when overflowing so that the counter continuously counts and increments its output value. A software control algorithm 114 is programmed in the memory of controller 22 and performs a processing function on the received data and any other control functions that may be programmed into the controller 22.

Figure 4:
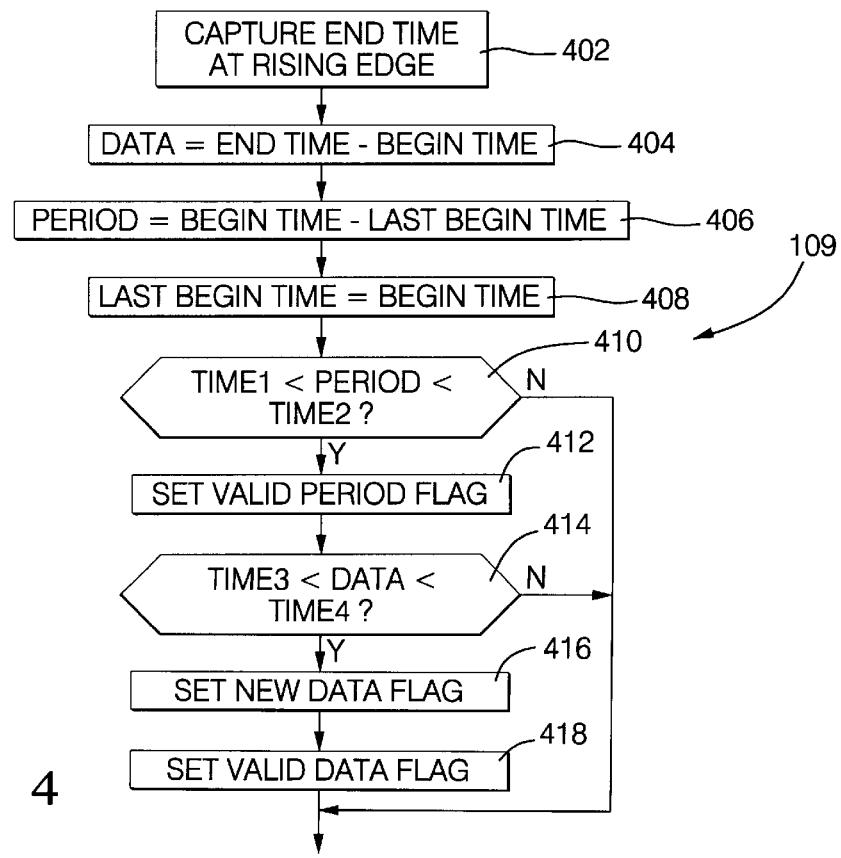
FIG. 4 is an example flow diagram of an interrupt service routine performed by controller 22.

More particularly, when the serial data 100 receives a falling edge of the signal on line 20, function 102 triggers an interrupt routine 108, which stores as BEGIN TIME the output value of the free running counter 106 occurring when the falling edge of the signal on line 20 is detected. Similarly, when a rising edge occurs on line 20, function 104 triggers interrupt routine 109, which is now described also with reference to FIG. 4.

At block 402, the interrupt routine loads the variable END TIME with the output value of the free running counter 106 that occurs at the capture of the rising edge of the signal on line 20. Block 404 computes the value DATA equal to the difference between END TIME and BEGIN TIME. Block 406 determines the value PERIOD as equal to BEGIN TIME minus LAST BEGIN TIME, which is a variable automatically updated (block 408) to equal the most recent previous value of BEGIN TIME.

Blocks 410–418 allow implementation of one or more of the diagnostics features described below with reference to FIGS. 6–9. Block 410 compares the value PERIOD to upper and lower thresholds TIME1 and TIME2, defining upper and lower boundaries determined by the system designer for valid values of PERIOD. If PERIOD is not between TIME1 and TIME2, then the interrupt routine 109 is exited. If PERIOD is between TIME1 and TIME2, then block 412 sets the VALID PERIOD flag.

Block 414 compares DATA to upper and lower thresholds TIME3 and TIME4, defining the minimum and maximum values for the value DATA. If DATA is not between TIME3 and TIME4, the interrupt service 109 ends. If DATA is between TIME3 and TIME4, then blocks 416 and 418 set the flags NEW DATA and VALID DATA, whose functions are described further below.

Referring again to FIG. 3, the control algorithm 114 performs control functions having any general purpose desired by one skilled in the art and contains step 116 that monitor whether or not the NEW DATA flag indicating new data has been received is set. If the NEW DATA flag is not set, then the data process function block 130 is bypassed and the control algorithm performs whatever other functions are programmed therein by the system designer.

The process data block 130 is bypassed when there is no new data because the process data block is of a type that is most accurate when it is processed only once for each new data signal. For example, in a system where the sensor 10 monitors a parameter and is sampled by the controller 14, which then transmits the sampled sensor data to the controller 22, which then processes the sampled data, for example, through a digital filter or through mathematical operation to determine the rate of change of the sensor data, the processing block then is most accurate when the function such as the filter or differentiator is processed only once for each new sampled data signal from sensor 10. Thus bypassing the process data block 130 when the flag indicating a new data signal is not set allows synchronization of the process data block 130 with the receipt of each new data signal on line 20, which was transmitted synchronously with each new sample data signal received by controller 14.

Block 132 resets the NEW DATA flag after the data is processed at block 130 thus preventing the process data block from being performed again until a new data signal is received, triggering the interrupt service 107.

Figure 5:
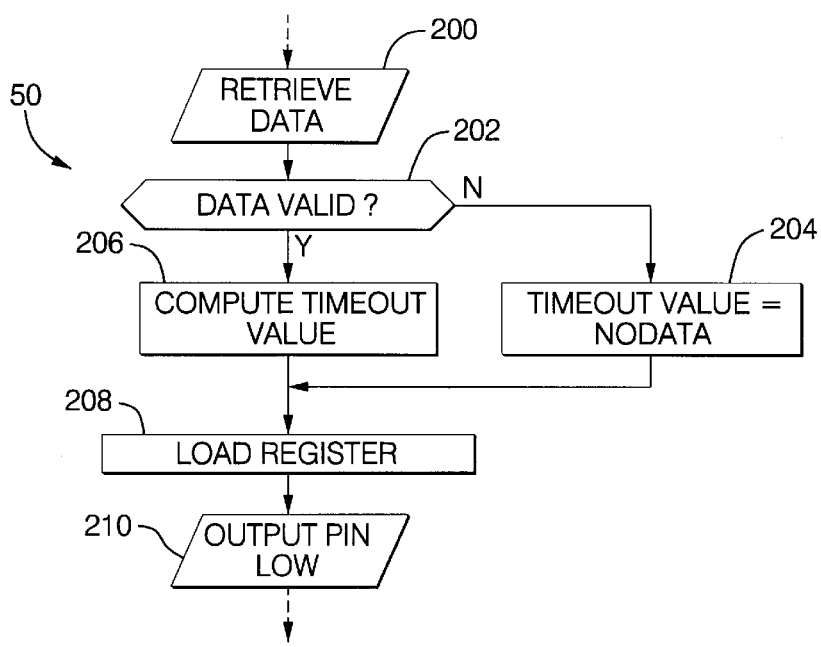
FIG. 5 is an example flow diagram of software commands performed by controller 14.

Referring now to FIG. 5, another example of steps performed by control algorithm 50 within controller 14 are shown. According to the steps shown in FIG. 5, the signal transmitted over serial data line 20 is generated to indicate whether or not the data signal itself contains valid data. This is done by determining a predetermined range of valid data, for example, requiring the on time of the data period to be longer than a first predetermined time threshold (TIME3, block 414, FIG. 4) and shorter than a second predetermined time threshold (TIME4, block 414, FIG. 4). Then, if the sensor data is determined to be invalid by whatever diagnostic tests are applicable for the particular sensor being implemented, a serial data signal is still generated but is outside the predetermined range for valid data. This allows the receiving controller 22 to receive a signal verifying that the serial data line functions properly while determining, when the data is out of range, that no valid sensed data was retrieved by the controller 14. For example, if no valid sensed data is retrieved, but the data transmission hardware is working properly, the interrupt routine 109 described above with reference to FIG. 4 sets the VALID PERIOD flag but does not set the NEW DATA or the VALID DATA flags.

More particularly, block 200 retrieves the sensor data from the controller data input and block 202 performs whatever tests are appropriate to determine whether or not the data is valid. This could be a simple threshold test which requires the data to be within high and low thresholds and may include tests to indicate other sensor malfunctions such as short circuit or even lack of signal generation. Such diagnostic functions are well known to those skilled in the art for various types of sensors suitable for use with this invention and need not be set forth herein in detail. If the data is not valid, then block 204 sets the time out value equal to a predetermined value, NO DATA, which is a value that will create a serial data signal on line 20 with an on time outside the range known by the receiving controller 22 to define acceptable data. For example, NO DATA is set less than TIME3 or greater than TIME4. If the data is valid at block 202, then block 206 computes the time out value as described above with reference to FIG. 2, it being understood that the time out value computed at block 206 is limited to a predetermined range, i.e., greater than TIME3 and less than TIME4, that does not include the value NO DATA.

Block 208 loads the register 60 in FIG. 2 and block 210 commands the serial data output port block 68, driving the signal low to generate the leading edge of the serial data signal. The remainder of the serial data signal is controlled as described above with reference to FIG. 2.

Figure 6:
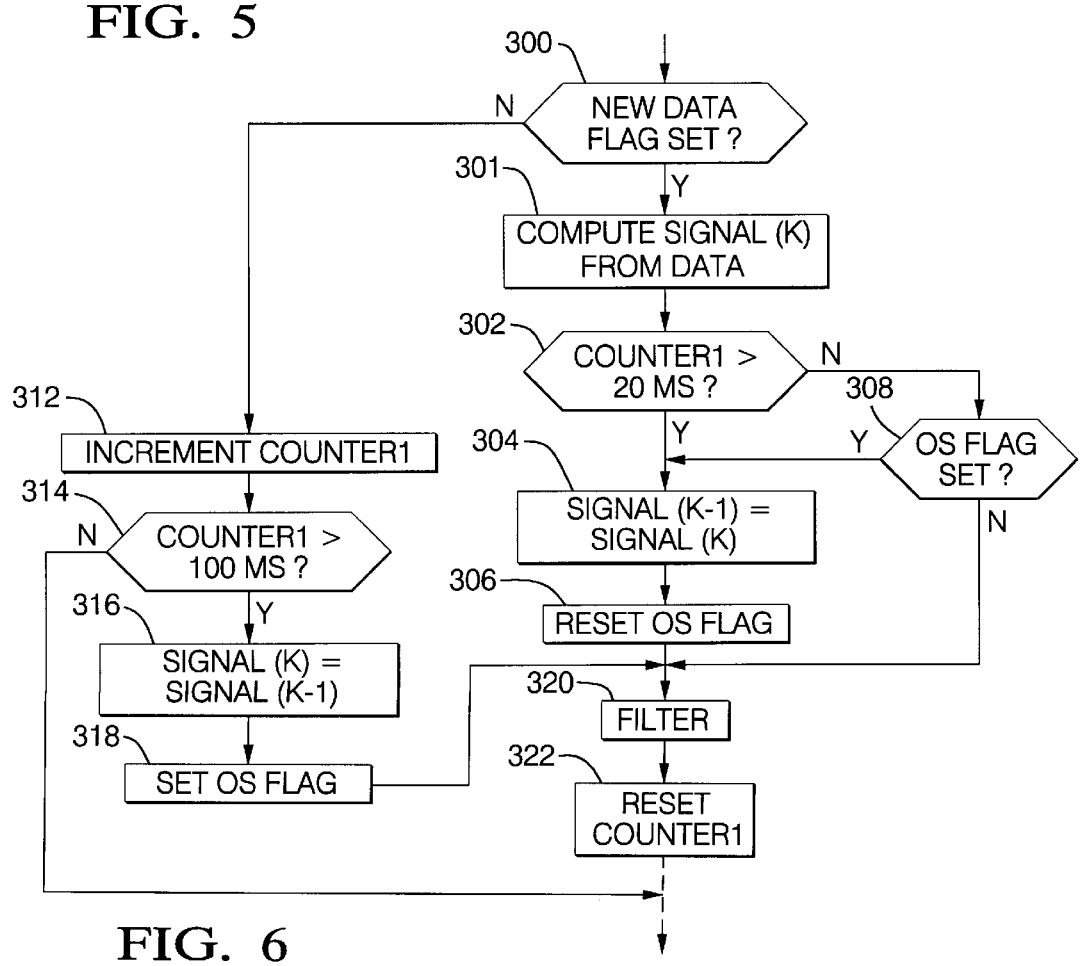
FIG. 6 is an example flow diagram of software commands performed by controller 22.

Referring now to FIG. 6, the flow diagram shown illustrates a second set of example control functions that may be performed by control algorithm 114 within controller 22 for receiving and processing the data. The example shown in FIG. 6 is suitable for use when the data is from a sensor such as a position sensor and the data is differentiated, for example by a differentiating filter, so that the output of the filter indicates velocity or rate of change of position of the parameter being measured. Such a filter may have a transfer function:

$$y(k)=g*(x(k)-x(k-1))+c_1*y(k-1)+c_2*y(k-2), y(k-2)=y(k-1); y(k-1)=y(k); x(k-1)=x(k)$$

where x(k) is the filter input at time k (SIGNAL(k)), y(k) is the filter output at time k, $c_2$ is a predetermined constant less than zero, $c_1$ is a predetermined constant and g is a predetermined gain.

It is apparent from the above equation that the example differentiating filter (a) has memory and (b) presumes a constant time period between sampled data. One skilled in the art will recognize that, because the filter has memory (i.e., the present output of the filter depends upon previous outputs), the constant time period between samples of data may be allowed limited variation as long as the variations are within a predetermined reasonable range so as not to introduce significant error into the filter output. However, because the filter has memory and because variations in time periods between successive signals should be within a limited range of the ideal time period, it is desired that the filter function recognize when there is no data being received or when data being received is outside the time period set by the system designer as the maximum threshold time between successive data signals.

Thus, at block 300 the routine determines whether the NEW DATA flag is set. If the NEW DATA flag is not set, block 312 increments a value, COUNTER1. The value COUNTER1 represents the time since the last trailing edge of a data signal has been received. Block 314 compares the value COUNTER1 to a predetermined threshold, for example 100 milliseconds. If COUNTER1 is not greater than 100 milliseconds, then the subroutine shown is bypassed and returned to at the next control loop of the control algorithm. If the value COUNTER1 is greater than 100 milliseconds, then it is assumed that an error has occurred preventing transmission of data from controller 14 to controller 22. Block 316 then sets the value SIGNAL(k) equal to the value SIGNAL(k-1), where SIGNAL(k-1) is the last determined data value (block 301). Block 318 then sets the OS flag.

The routine then continues to block 320, which implements, for example, the differentiating filter described above. By setting the value SIGNAL(k) equal to the value SIGNAL(k-1), the output of filter 320 will be eventually driven to zero unless valid data is again received by controller 22. After filter 320, block 322 resets the value of COUNTER1 and control algorithm 114 for processing the data is completed until the next control loop.

If at block 300 the NEW DATA flag is set, then the routine continues to block 301 where the value SIGNAL(k) is determined as a function of DATA and the NEW DATA flag is reset. For example, block 301 can be implemented as a look-up table function to perform the desired conversion of the signal DATA, which indicates the on time of the data pulse, to a value representative of the parameter sensed by sensor 10 (FIG. 1). Such look-up table conversion functions are easily implemented by those skilled in the art.

Next block 302 compares COUNTER1 to a value, for example, of 20 milliseconds. If COUNTER1 is not greater than 20 milliseconds, then block 308 determines whether or not the OS flag is set. If the OS flag is not set and the COUNTER1 is not greater than 20 milliseconds, then full functional operation of the serial data transmission and reception is presumed and the routine continues directly to the filter 320. Otherwise, if either the OS flag is set or the COUNTER1 is greater than 20 milliseconds, then the routine continues to block 304 where the value SIGNAL(k-1) is set equal to the value SIGNAL(k) and block 306 resets the OS flag. Then the filter 320 is performed. This operation will drive the filter output to zero if the data signals are received more than 20 milliseconds apart where, in this example, 20 milliseconds is the upper threshold for the time period between successive signals for appropriate operation of the filter.

In the event that the OS flag is set, the function of block 304 re-initiates the filter with the present data signal as both SIGNAL(k) and SIGNAL(k-1). Additionally, the OS flag may trigger an error signal elsewhere in the control algorithm to drive an output (e.g., a telltale) indicating service may be required. In the event that the filter 320 is driven to zero, then whatever control functions rely on the filter 320 may be run in a default mode as desired by a system designer until appropriate operation is again reestablished.

Figure 7:
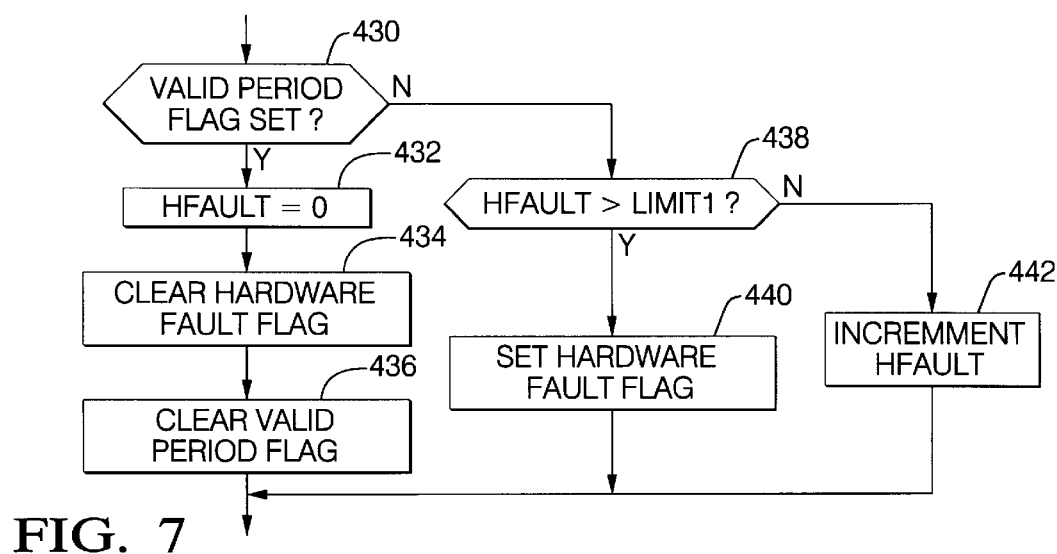
FIGS. 7, 8 and 9 are example flow diagrams of diagnostics performed by controller 22.
Figure 8:
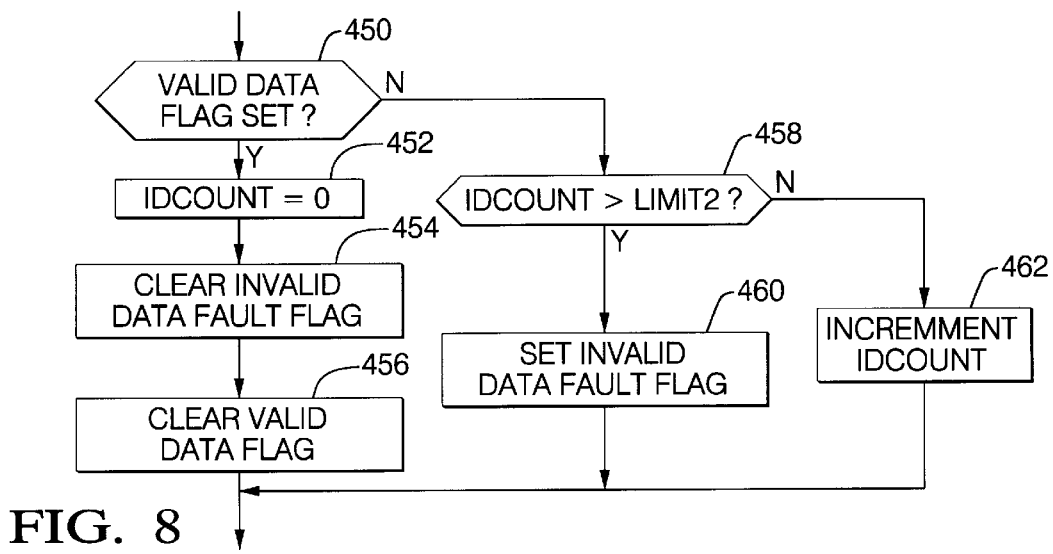
Figure 9:
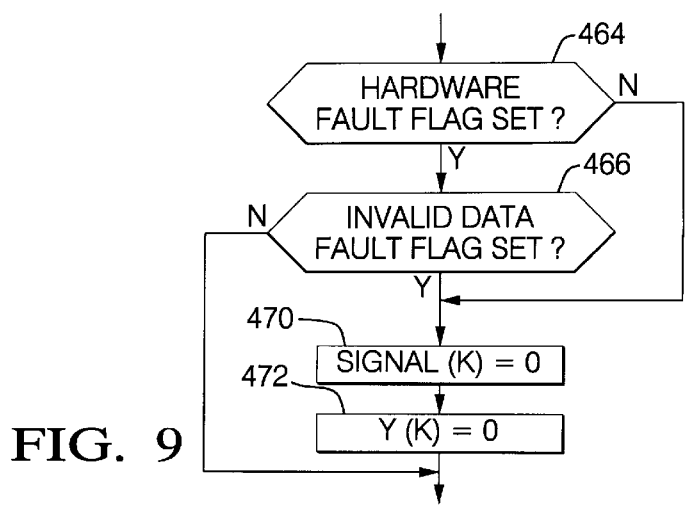

FIGS. 7, 8 and 9 illustrate software diagnostic controls that may be implemented using the VALID PERIOD and VALID DATA flags described above with reference to FIG. 4. The diagnostics shown in FIGS. 7, 8 and 9 may be carried out by the control algorithm 114, for example, sequentially after the step shown in FIG. 6 are carried out.

Referring now to FIG. 7, block 430 checks whether the VALID PERIOD flag is set. If the VALID PERIOD flag is set, then block 432 sets the counter HFAULT to zero. Block 434 next clears the HARDWARE FAULT flag, which is set to indicate that a fault in the serial data hardware is determined as described below with reference to blocks 438, 440 and 442. Block 436 then clears the VALID PERIOD flag and the routine in FIG. 7 is completed.

If at block 430, the VALID PERIOD flag is not set, the routine continues to block 438 where the counter HFAULT is compared to its time-out value, for example, 1 s. If HFAULT is not greater than its time-out value, then block 442 increments the HFAULT counter and the routine in FIG. 7 is completed. If at block 438 the HFAULT counter is greater than its time-out value, which occurs when the VALID PERIOD flag has not occurred for an entire period designated by the time-out value, then a fault in the serial data transmission and/or reception hardware is presumed and block 440 sets the HARDWARE FAULT flag. The HARDWARE FAULT flag may be used, for example, to cause a telltale in the vehicle instrument cluster to illuminate, indicating to a vehicle operator that the vehicle should be serviced.

Referring now to FIG. 8, the block 450 checks the VALID DATA flag. If the VALID DATA flag is set, the routine continues to block 452 where the counter IDCOUNT is set to zero. At block 454, the flag INVALID DATA FAULT is reset and at block 456, the VALID DATA flag is cleared. After block 456 the routine shown in FIG. 8 is terminated.

If at block 450 the VALID DATA flag is not set, the routine continues to block 458 where the counter IDCOUNT is compared to its timeout value, for example, 1 s. If IDCOUNT is not greater than its time-out value, then block 462 increments IDCOUNT and the routine of FIG. 8 is completed.

If at block 458 IDCOUNT is greater than its time-out value, then it is presumed that no valid data is being received and block 460 sets the INVALID DATA FAULT flag.

Referring not to FIG. 9, blocks 464 and 466 check the HARDWARE FAULT and INVALID DATA FAULT flags. If either flag is set, the routine continues to blocks 470 and 472 where the values SIGNAL(k) and the filter output (y(k)) are set to zero. After blocks 466 and 472, the routine in FIG. 9 is terminated.

We claim:

1. In a first controller that runs a first control algorithm and a first interrupt service, wherein the first control algorithm includes a first series of commands repeatedly executed in sequence, wherein the first interrupt service performs a second series of commands when the first interrupt service is triggered, wherein the first controller includes a first free running counter with a first counter value that repeatedly increments and resets when the first counter overflows, a data communication method comprising the steps of:

in each sequential execution of the first series of commands:
    reading a data signal to be transmitted;
    responsive to the data signal, computing an on-time;
    setting a first edge of a serial transmission signal; and
    loading a register with a value equal to a sum of the first counter value and the on-time;
  independent of the first series of commands:
    comparing the first counter value to the register value;
    when the first counter value equals the register value, triggering the first interrupt service; and
    when the first interrupt service is triggered, resetting a second edge of the serial transmission signal, wherein the first edge is not set again until a new data signal to be transmitted is read.

2. A data communication method according to claim 1, wherein a second controller includes a second control algorithm containing a third series of commands repeatedly executed in sequence and a second interrupt service including a fourth series of commands executed when the second interrupt service is triggered, wherein the serial transmission signal is transmitted from the first controller to the second controller, also comprising the steps of:

in the second interrupt service:
    detecting the first edge of the serial transmission signal;
    capturing a begin time when the first edge is detected;
    detecting the second edge of the serial transmission signal;
    capturing an end time when the second edge is detected;
    determining a received signal equal to a difference between the end time and the begin time; and
    setting a flag when the received signal is determined;
  during each execution of the third series of commands:
    monitoring the flag;
    when the flag is set, processing the received signal; and
    after the received signal is processed, resetting the flag, wherein the processing step is not executed again until a new received signal is determined.

3. A data communication apparatus comprising a first controller including a first free running counter with a first counter value that repeatedly increments and resets when the first counter overflows, the first controller further comprising:

first means for, in each repeated execution of a first series of commands, reading a data signal to be transmitted, computing an on-time in response to the data signal, setting a first edge of a serial transmission signal, and loading a register with a value equal to a sum of the first counter value and the on-time;
  second means, independent of the first series of commands, for comparing the first counter value to the register value and triggering a first interrupt when the first counter value equals the register value; and
  third means for resetting a second edge of the serial transmission signal in a second series of commands when the first interrupt service is triggered, the first means subsequently not setting the first edge again until a new data signal to be transmitted is read.

4. A data communication according to claim 3 further comprising a second controller, the second controller comprising:

fourth means for receiving the serial transmission signal from the first controller, triggering a second interrupt when the first edge of the serial transmission signal is detected and when the second edge of the serial transmission is detected;
  fifth means responsive to the triggering of the second interrupt for capturing a begin time when the first edge is detected, capturing an end time when the second edge is detected, determining a received signal equal to a difference between the end time and the begin time, and setting a flag when the received signal is determined; and
  sixth means for, in each repeated execution of a third series of commands, monitoring the flag, processing the received signal when the flag is set, and resetting the flag when the received signal is processed, wherein the received signal is not processed again by the sixth means until a new signal is determined.

\* \* \* \* \*